United States Patent [19]

Possin et al.

[11] Patent Number: 4,704,783

[45] Date of Patent: Nov. 10, 1987

[54] METHOD FOR PASSIVATING THE BACK CHANNEL OF AMORPHOUS SILICON FIELD EFFECT TRANSISTORS

[75] Inventors: George E. Possin, Schenectady; Harold G. Parks; William W. Piper, both of Scotia, all of N.Y.

[73] Assignee: General Electric Company, Schenectady, N.Y.

[21] Appl. No.: 859,526

[22] Filed: May 5, 1986

[51] Int. Cl.⁴ .................................... H01L 29/78
[52] U.S. Cl. ................................. 437/40; 156/643; 148/DIG. 1; 437/101; 437/233
[58] Field of Search ............... 29/569 R, 571, 590; 156/643, 646, 651; 427/94; 148/DIG. 1, DIG. 131

[56] References Cited

U.S. PATENT DOCUMENTS

| | | | |
|---|---|---|---|
| 4,545,112 | 10/1985 | Holmberg et al. | 29/577 R |
| 4,563,806 | 1/1986 | Coissard et al. | 29/571 |
| 4,646,424 | 3/1987 | Parks et al. | 29/571 |

OTHER PUBLICATIONS

"Silicon TFTs for Flat Panel Displays", by F. Morin and M. LeContellec, *Hewlett Packard Journal*, (date unknown).

"Amorphous-Silicon Thin-Film Metal-Oxide-Semiconductor Transistors", by Hiroshi Hayama and Masakiyo Matsumura, *Applied Physics Letters*, vol. 36, No. 9 (May 1980).

"Amorphous Silicon-Silicon Nitride Thin-Film Transistors" by M. J. Powell et al., *Applied Physics Letters*, vol. 38, No. 10 (May 1981).

"Application of Amorphous Silicon Field Effect Transistors in Addressable Liquid Crystal Display Panels" by A. J. Snell et al., *Applied Physics*, vol. 24, pp. 357–362 (1981).

"A TFT-Addressed Liquid Crystal Color Display" by M. Sugata et al. (Oct. 1983), Proceedings of the Third International Display Research Conference, Paper No. 53.

"Amorphous-Silicon TFT Array for LCD Addressing" by M. V. C. Stroomer, *Electronic Letters*, vol. 18, No. 20 (1982).

"High Resolution Transparent-Type a-Si TFT LCDs" by K. Suzuki et al., *SID Digest*, (1093).

"Promise and Challenge of Thin-Film Silicon Approaches to Active Matrices", by A. I. Lakatos, 1982 International Display Research Conference, IEEE, pp. 146–151.

"Application of Amorphous Silicon Field Effect Transistors in Integrated Circuits" by A. J. Snell et al., *Applied Physics*, vol. A26, pp. 83–86.

*Primary Examiner*—Olik Chaudhuri
*Attorney, Agent, or Firm*—Lawrence D. Cutter; James C. Davis, Jr.; Marvin Snyder

[57] ABSTRACT

An organic or inorganic base solution is employed as a means for passivating the back channel region of an amorphous silicon FET device following plasma etching of the back channel region. The passivation provided significantly reduces back channel leakage currents resulting in FET devices which are compatible with conventional processing methods and which exhibit desirable properties for use in liquid crystal display systems.

10 Claims, 3 Drawing Figures

METHOD FOR PASSIVATING THE BACK CHANNEL OF AMORPHOUS SILICON FIELD EFFECT TRANSISTORS

BACKGROUND OF THE INVENTION

The present invention is generally directed to a method for passivating the back channel regions in amorphous silicon field effect transistors (FETs), particularly those employed in matrix addressed liquid crystal displays. More particularly, the present invention is related to a treatment process for amorphous silicon FET devices which results in significantly reduced levels of transistor "OFF" current.

In matrix addressed liquid crystal displays (LCDs), it is known to employ field effect transistor devices at each picture element (pixel). For display applications, each pixel is approximately 100 microns square. In matrix addressed liquid crystal displays, each one of the pixel elements is turned on and off through the operation of an FET. Furthermore, the desirability of low temperature processing favors the utilization of FET devices comprising doped and undoped amorphous silicon. In operation, a selected FET or set of FETs is turned "ON" and charge is permitted to accumulate on an adjoining pixel electrode, which together with a ground plane electrode, acts very much like a capacitive storage device. The electric field between the pixel electrode and a transparent ground plane electrode preferentially affects liquid crystal material disposed between these electrodes in a manner which changes their optical properties and thereby provides a display function. For purposes of image display stability, it is desired that any current that flows during FET "OFF" conditions is minimal. Typically, the OFF current is required to be less than 50 picoamperes. Low OFF currents ensure that charge placed upon the pixel electrodes persists for a desirably long time without the need for immediate refreshing. During this time, other pixels in the display may be addressed.

Amorphous silicon FETs typically employed in matrix addressed liquid crystal displays employ a structure in which a portion of the amorphous silicon material is exposed through a metal contact layer. The amorphous silicon layer also includes an upper layer of doped amorphous silicon material, this latter layer being exposed through openings in a metal contact layer. The region at the bottom of this contact metal gap forms the channel region of the device. It is known to remove the doped amorphous silicon layer between the metal contacts by etching methods. Typically an N+ layer of amorphous silicon is removed by etching in a barrel plasma etcher using molybdenum source and drain contact metal patterns as a mask. After etching, it is necessary to protect the exposed silicon surface from environmental contamination. The present invention is directed to a method for providing a desired degree of protection. If this protection is not provided, a net positive charge state tends to be produced on the exposed silicon surface. This induces an electron channel in the near surface region. These electrons are mobile and produce conduction between the source and drain, resulting in so-called back channel leakage. This back channel leakage increases OFF current levels. Since low OFF currents are required for display and imaging applications, this is a significant problem in devices of this kind. While silicon nitride protective caps are often employed as a passivating material, subsequent to back channel etching, it has been found that such passivating means alone are much more susceptible to the production of back channel leakage than processing in accordance with the present invention.

SUMMARY OF THE INVENTION

In accordance with a preferred embodiment of the present invention, a method for passivating the back channel region of amorphous silicon FETs comprises a sequence of process steps starting with the etching of a layer of doped amorphous silicon material at the bottom of a gap in an overlying metal layer. This first etching is performed to remove approximately 10 nanometers of material which is thought to comprise a layer of $SiO_2$ or $MoSi_x$ of unknown composition which tends to form during sputter deposition of molybdenum source and drain metal and also during subsequent processing steps. Next, the doped amorphous silicon material is etched along with a portion of the underlying amorphous silicon material. Most importantly, with respect to the present invention, the back channel region thus formed is exposed to an organic base prior to formation of a passivating cap, such as silicon nitride. In accordance with a preferred embodiment of the present invention, the organic base comprises a monoethanolamine solution. Also, the present invention preferably includes rinsing the FET in distilled water and heating in air immediately subsequent to exposure to the organic base. Back channel leakage currents have thus been seen to have been reduced from approximately 50 picoamperes to current levels which are typically less than 1 picoampere.

Accordingly, it is an object of the present invention to provide passivation for the back channel region of amorphous silicon FETs.

It is also an object of the present invention to produce FETs which exhibit low levels of back channel leakage current.

It is yet another object of the present invention to provide FET devices which are useful in the fabrication of matrix addressed liquid crystal displays.

Lastly, but not limited hereto, it is an object of the present invention to provide a process for the fabrication of FET devices which is at the same time economical and in keeping with conventional FET fabrication methods.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
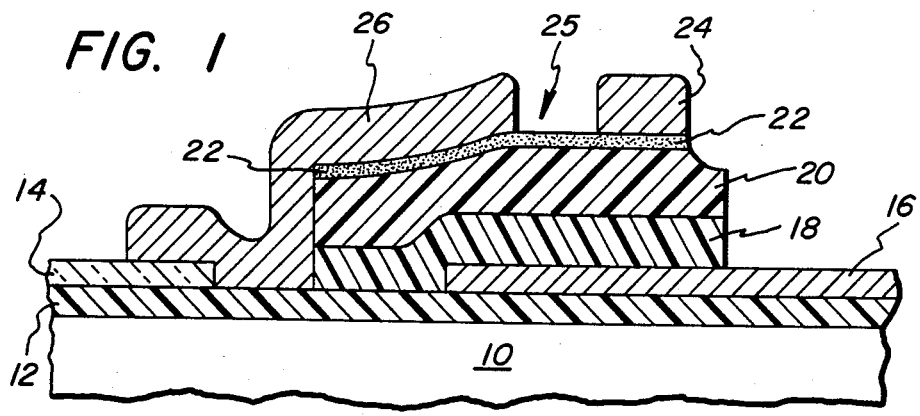
FIG. 1 is a cross-sectional, side elevation view illustrating a stage in FET processing prior to etch back of the amorphous silicon in the channel region.

FIG. 1 illustrates, in cross-sectional view, a typical amorphous silicon FET, as employed in a matrix addressed liquid crystal display device. In particular, an insulating layer of silicon oxide 12 is disposed on glass substrate 10. A portion of pixel electrode 14 is also visible. This electrode typically comprises a transparent conductive material such as indium tin oxide. Also disposed over insulating layer 12 is conductive gate metal 16 typically comprising a material such as titanium. An insulative layer 18 is disposed between gate material 16 and amorphous silicon material 20. Insulative layer 18 typically comprises a material such as silicon nitride. FIG. 1 also illustrates the fact that amorphous silicon material 20 also includes an upper layer 22 of doped silicon material. Typically an N+ dopant, such as phosphorous, is employed. Overlying this structure, source and drain metallization patterns 24 and 26 are provided. In particular, contact 26 also acts to connect the FET with pixel electrode 14. Since the ground plane electrode and the liquid crystal material itself are not necessary for understanding the present invention and since they are conventionally known features, they are not illustrated herein.

For proper FET operation, it is necessary to remove the portion of doped amorphous silicon layer 22 at the bottom of gap 25. However, prior to plasma etching of layers 22 and part of layer 20 in a barrel plasma etcher to remove N+ material from the back channel, it has also been found that it is desirable to sputter etch the wafers in an argon atmosphere to remove approximately 10 nanometers of material (not shown because of scale). It is believed that this material is a layer of $SiO_2$ or $MoSi_x$ of unknown composition which tends to form during sputter deposition of molybdenum source and drain material. This surface layer etches very slowly in barrel etchers and would therefore tend to result in non-uniform removal of the N+ layer if not removed by sputter etching. This sputter etching step is highly desirable to provide good control for subsequent barrel etching. While barrel etching is preferred, a planar etcher may be desired in the event that wafer scale uniformity becomes important.

Figure 2:
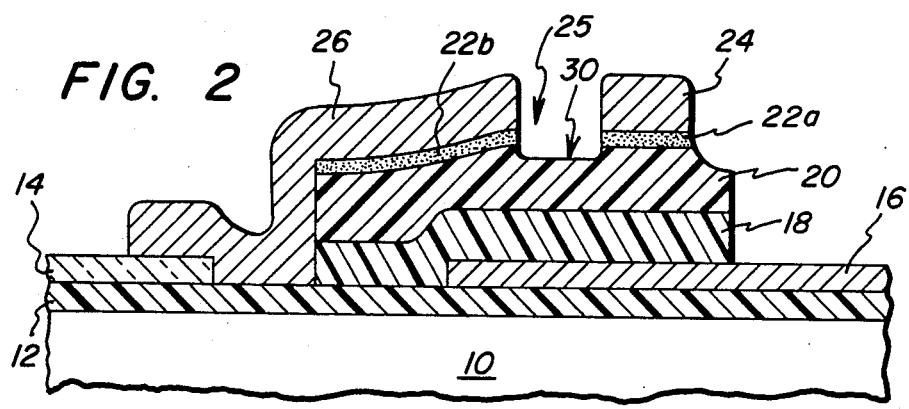
FIG. 2 is a view similar to FIG. 1 illustrating the effect of back channel etching.

Subsequent to sputter etching, plasma etching of layer 22 and a portion of layer 20 is performed, as illustrated in FIG. 2. Subsequent to this plasma etching which is preferably done in a barrel etcher, the OFF currents of the devices are very low indicating no electron accumulation layer in back channel region 30. However, if these devices are capped using plasma deposited amorphous silicon nitride, the OFF currents rise dramatically.

However, and most importantly for the present invention, if the surface is exposed to a monoethanolamine solution, at about 60° C., rinsed in distilled water, and air baked at approximately 250° C. for 15 minutes prior to capping, the OFF currents are typically less than 1 picoampere for an FET with a channel length of 6 microns and width of 200 microns. The OFF current is typically required to be less than 50 picoamperes for LCD type applications. A monoethanolamine solution which is a strong base, such as commercial resist stripper R10 for example, is therefore seen to be employable as a passivating treatment following back channel etching of amorphous silicon FETs. While a monoethanolamine solution is a preferred material for such passivation, organic and inorganic bases provide similar passivation.

Figure 3:
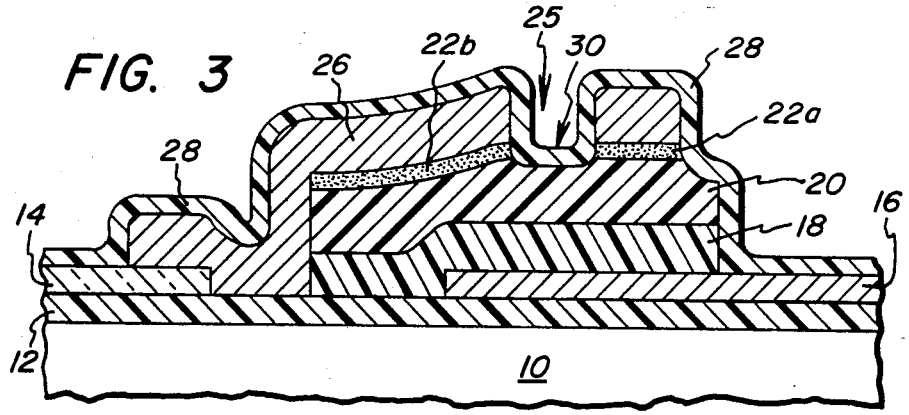
FIG. 3 is a view similar to FIG. 2 and which more particularly illustrates the formation of a final passivation layer.

It is noted that contact metal patterns 24 and 26 provide masking for the plasma etching of the doped amorphous silicon and underlying amorphous silicon layers. Following the passivation step of exposing amorphous silicon to a basic solution, a permanent passivating cap 28, as shown in FIG. 3, is provided over the substrate. Cap, or dielectric insulating layer 28, preferably comprises a material such as silicon nitride. More particularly, cap 28 preferably comprises silicon nitride which is deposited by plasma chemical vapor deposition at a temperature of approximately 150° C. It is also pointed out that plasma etching of the doped amorphous silicon material, as occurs between the steps illustrated in FIGS. 1 and 2, results in the formation of doped source and drain layers 22a and 22b, as shown.

Accordingly, it is seen from above that the present invention provides a method for passivating the back channel region of amorphous silicon field effect transistors. The method is seen to involve plasma etching for removing N+ doped silicon from the back channel and then providing a sequence of wet and dry chemistry prior to capping with a low temperature silicon nitride layer to produce a protected and stable device. It is also seen that the passivation process of the present invention is in conformance with conventional FET and LCD display fabrication methods. It is also seen that the passivation method provided in the present invention results in significantly reduced FET back channel leakage currents and accordingly, results in an FET device which is much more suitable for use in LCD devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for passivating the back channel region of amorphous silicon field effect transistors, said method comprising the following ordered sequence of process steps:
   sputter etching doped amorphous silicon material at the bottom of a gap in an overlying metal layer;
   plasma etching said doped amorphous silicon material and a portion of an underlying amorphous silicon layer;
   exposing said amorphous silicon surface to a basic solution; and
   depositing a passivating dielectric layer over said field effect transistor.

2. The method of claim 1 in which said sputter etching occurs in an argon atmosphere.

3. The method of claim 1 in which said plasma etching is performed in a barrel plasma etcher.

4. The method of claim 1 in which said base comprises an inorganic base.

5. The method of claim 1 in which said base comprises an organic base.

6. The method of claim 5 in which said organic base comprises a monoethanolamine solution.

7. The method of claim 1 further including immediately subsequent to exposure to said basic solution, the steps of:
   rinsing said FET in distilled water and heating in air.

8. The method of claim 7 in which said heating in air occurs at a temperature of approximately 250° C. for approximately 15 minutes.

9. The method of claim 1 in which said passivating layer comprises silicon nitride deposited by plasma chemical vapor deposition.

10. The method of claim 9 in which said passivating layer is deposited at a temperature of approximately 150° C.

* * * * *